(12) United States Patent
Lee

(10) Patent No.: US 7,972,929 B2
(45) Date of Patent: Jul. 5, 2011

(54) METHOD FOR MANUFACTURING SEMICONDCUTOR DEVICE

(75) Inventor: In-Kun Lee, Suji-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 513 days.

(21) Appl. No.: 12/252,455

(22) Filed: Oct. 16, 2008

(65) Prior Publication Data

US 2009/0104780 A1    Apr. 23, 2009

(30) Foreign Application Priority Data

Oct. 17, 2007  (KR) .................. 10-2007-0104444

(51) Int. Cl.
*H01L 21/8234*     (2006.01)

(52) U.S. Cl. ........ 438/275; 438/400; 438/694; 438/703; 257/500; 257/E21.66; 257/E21.678; 257/E21.683; 257/E21.691

(58) Field of Classification Search ................... 438/400, 438/694, 703, 275; 257/500, E21.66, E21.678, 257/E21.683, E21.691
See application file for complete search history.

(56) References Cited

U.S. PATENT DOCUMENTS

| | | | |
|---|---|---|---|
| 6,399,443 B1 * | 6/2002 | Chwa et al. | 438/258 |
| 7,084,035 B2 * | 8/2006 | Ueda | 438/275 |
| 7,635,653 B2 * | 12/2009 | Hashimoto et al. | 438/766 |
| 2003/0151109 A1 * | 8/2003 | Taniguchi et al. | 257/500 |
| 2006/0099755 A1 * | 5/2006 | Mori | 438/201 |
| 2007/0284645 A1 * | 12/2007 | Lee et al. | 257/314 |

* cited by examiner

*Primary Examiner* — Wael M Fahmy
*Assistant Examiner* — Yu-Hsi Sun
(74) *Attorney, Agent, or Firm* — Sherr & Vaughn, PLLC

(57) ABSTRACT

A method for manufacturing a semiconductor device includes forming an ONO layer in a memory region and forming several gate oxide layer patterns in a logic region, a nitride layer in the logic region can be used as a hard mask, enabling a reduction in the number of masks used. This results in improved manufacturing efficiency and reduced manufacturing costs of a SONOS semiconductor device.

20 Claims, 4 Drawing Sheets

METHOD FOR MANUFACTURING SEMICONDCUTOR DEVICE

Figure 1A:
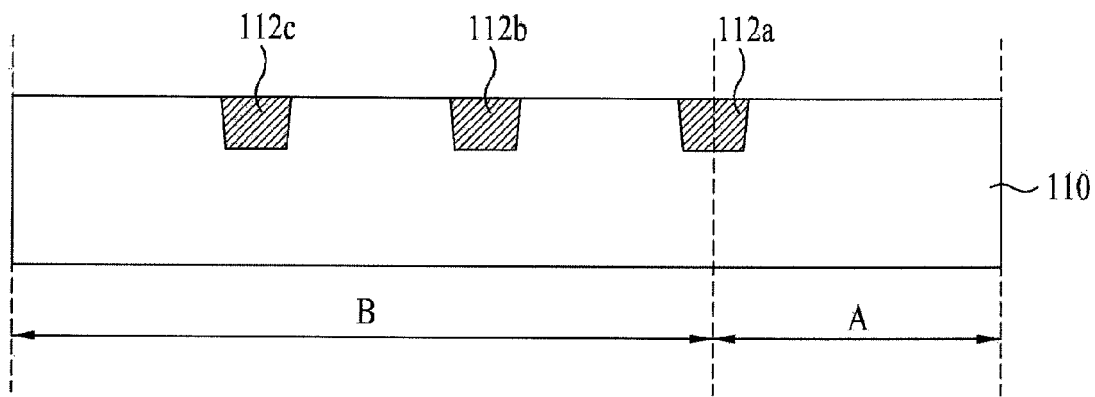

The present application claims priority under 35 U.S.C. §119 to Korean Patent Application No. 10-2007-0104444 (filed on Oct. 17, 2007), which is hereby incorporated by reference in its entirety.

BACKGROUND

Aspects of semiconductor fabrication technology have focused on achieving highly integrated devices. In semiconductor memory devices, one frequently studied device is a nonvolatile silicon oxide nitride oxide silicon (SONOS) memory device. A difference between a SONOS device and a flash memory device is that, in a structural viewpoint, the flash memory device stores charges using a floating gate whereas the SONOS device stores charges in a nitride layer. Such a SONOS semiconductor device may include a memory region for storing charges and a logic region constituting a peripheral circuit. The memory region is defined on and/or over an oxide nitride oxide (ONO) layer including a nitride layer enabling charge trapping. The logic region is defined on and/or over a silicon oxide ($SiO_2$) layer as gate dielectrics.

In a method for manufacturing a SONOS semiconductor device, a device isolation layer is first formed on and/or over a silicon (Si) semiconductor substrate to divide a memory region and logic region from each other. In addition, to divide the logic region into a plurality of regions, a plurality of device isolation layers are formed. The logic region may include an ultra-high voltage region (Ultra V), a high voltage region (High V) and a low voltage region (Low V). Of the plurality of regions divided by the device isolation layers, an ONO layer, which includes a first oxide layer, a nitride layer and a second oxide layer, is formed only on and/or over the memory region.

The ONO layer is formed on and/or over the memory region via patterning using a first photoresist pattern. The first photoresist pattern is removed via etching and cleaning processes. Next, a first gate oxide layer, which may be composed of silicon oxide ($SiO_2$) is formed only on and/or over the memory region and the ultra-high voltage region (Ultra V) of the logic region. The first gate oxide layer is formed on and/or over the memory region and the ultra-high voltage region (Ultra V) via patterning using a second photoresist pattern. The second photoresist pattern is removed via etching and cleaning processes. Next, a second gate oxide layer, which may be composed of silicon oxide ($SiO_2$), is formed only on and/or over the high voltage region (High V) of the logic region. The second gate oxide layer is formed on and/or over the high voltage region (High V) via patterning using a third photoresist pattern. The third photoresist pattern is removed via etching and cleaning processes. Thereafter, silicon oxide ($SiO_2$) is deposited to form a third gate oxide layer on and/or over the entire surface of the semiconductor substrate.

In such a method for manufacturing a SONOS semiconductor device, the processes for forming the ONO layer on and/or over the memory region and forming several gate oxide layers on and/or over the logic region require three separate mask processes. Meaning, forming the gate oxide layers on and/or over the ultra-high voltage region, the high voltage region and the low voltage region of the logic region, three separate mask processes are implemented. Accordingly, the overall manufacturing time is undesirably long, resulting in poor manufacturing efficiency. Further, the additional number of manufacturing processes also increases overall manufacturing costs.

SUMMARY

Embodiments relate to a method for manufacturing a semiconductor device which reduces the number of overall manufacturing processes to achieve maximization in productivity and efficiency.

Embodiments relate to a method for manufacturing a SONOS semiconductor device which maximizes overall manufacturing efficiency and reduces overall manufacturing costs by reducing the overall number of mask processes.

Embodiments relate to a method for manufacturing a SONOS semiconductor device that may include at least one of the following steps: simultaneously forming a device isolation layer in a semiconductor substrate to divide a memory region and logic region from each other and forming device isolation layers to divide the logic region into an ultra-high voltage region, a high voltage region and a low voltage region; and then forming an ONO layer by sequentially forming a first oxide layer, a nitride layer and a second oxide layer on and/or over the entire surface of the semiconductor substrate; and then forming a first photoresist pattern on and/or over the memory region and the high voltage region; and then forming an ONO layer pattern on and/or over the memory region and the high voltage region by implementing a first etching process using the first photoresist pattern as a mask; and then removing the first photoresist pattern; and then depositing a first silicon oxide ($SiO_2$) layer on and/or over the entire surface of the semiconductor substrate; and then forming a second photoresist pattern on and/or over the memory region and the ultra-high voltage region; and then removing the second oxide layer of the ONO layer pattern while forming a first gate oxide layer pattern composed of the first silicon oxide layer on and/or over the memory region and the ultra-high voltage region by implementing a second etching process using the second photoresist pattern as a mask; and then removing the nitride layer of the ONO layer pattern by implementing a third etching process on the semiconductor substrate; and then removing the second photoresist pattern; and then forming a second gate oxide layer pattern on and/or over the semiconductor substrate including the low voltage region by depositing a second silicon oxide ($SiO_2$) layer on and/or over the entire surface of the semiconductor substrate.

Embodiments relate to a method for manufacturing a SONOS semiconductor device that may include at least one of the following steps: simultaneously forming a device isolation layer in a semiconductor substrate to define a memory region and a logic region, and also forming device isolation layers to define the logic region into an ultra-high voltage region, a high voltage region and a low voltage region; and then forming an ONO layer in the logic region and the memory region by sequentially forming a first oxide layer, a nitride layer and a second oxide layer over the entire surface of the semiconductor substrate; and then forming a first photoresist pattern in the memory region and the high voltage region; and then forming an ONO layer pattern in the memory region and the high voltage region by implementing a first etching process using the first photoresist pattern as a mask; and then removing the first photoresist pattern; and then depositing a first silicon oxide material over the entire surface of the semiconductor substrate; and then forming a second photoresist pattern in the memory region and the ultra-high voltage region; and then simultaneously removing the second oxide layer of the ONO layer pattern in the high voltage region while forming a first gate oxide layer pattern composed of the first silicon oxide material in the memory region and the ultra-high voltage region by implementing a second etching process using the second photoresist pattern as a mask; and then removing the nitride layer of the ONO layer pattern in the high voltage region by implementing a third etching process on the semiconductor substrate; and then removing the second photoresist pattern; and then forming a second gate oxide layer pattern over the entire surface of the semiconductor substrate semiconductor substrate including the low voltage region.

DRAWINGS

Example FIGS. 1A to 1H illustrate a method for manufacturing a SONOS semiconductor device in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

As illustrated in example FIGS. 1A to 1H, a method for manufacturing a SONOS semiconductor device that includes a memory region storing charges and a logic region that includes a peripheral circuit.

As illustrated in example FIG. 1A, first device isolation layer 112a is formed on and/or over silicon (Si) semiconductor substrate 110 to divide memory region A and logic region B from each other. In addition, to divide the logic region B into a plurality of logic regions, a plurality of device isolation layers 112b and 112c are formed in semiconductor substrate 110. Logic region B includes ultra-high voltage region (Ultra V), high voltage region (High V) and low voltage region (Low V). Device isolation layers 112a, 112b and 112c may be formed via LOCal Oxidation of Silicon (LOCOS) or Shallow Trench Isolation (STI).

Figure 1B:
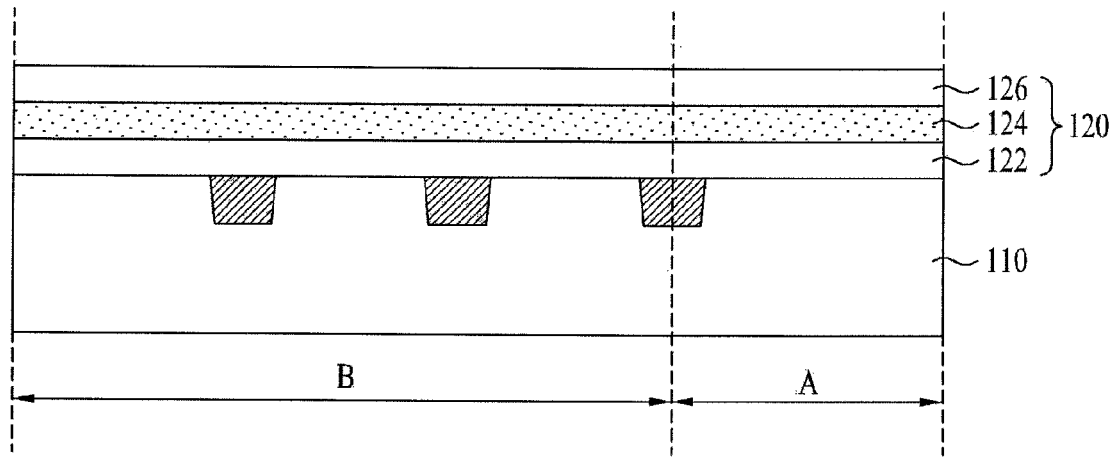

As illustrated in example FIG. 1B, ONO layer 120 is formed by sequentially depositing first oxide layer 122, nitride layer 124 and second oxide layer 126 on and/or over the entire surface of semiconductor substrate 110.

Figure 1C:
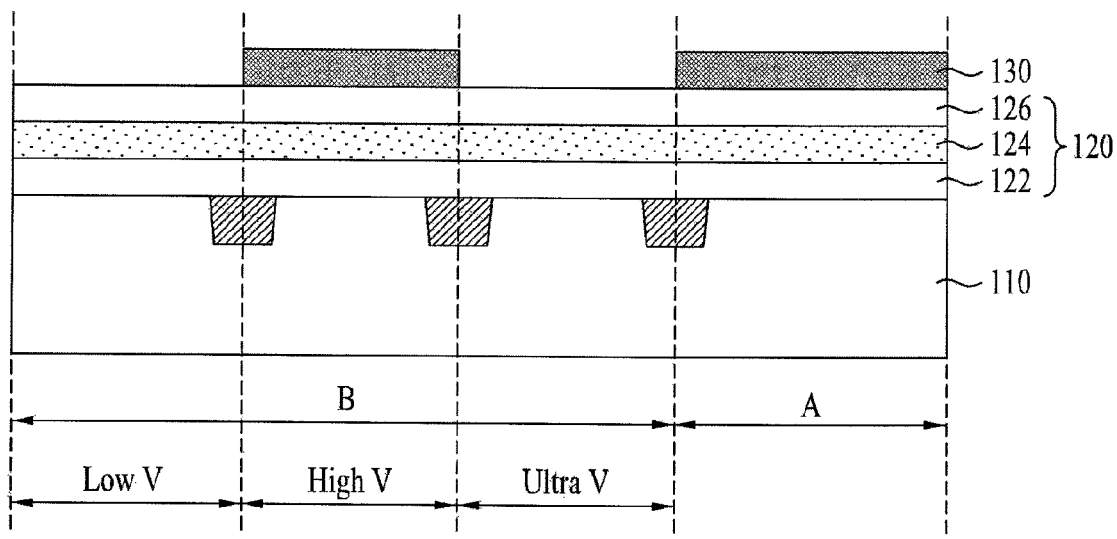

As illustrated in example FIG. 1C, after coating a photoresist material on and/or over semiconductor substrate 110, a photolithographic process is implemented, thereby forming first photoresist patterns 130 on and/or over memory region A and high voltage region (High V) of logic region B.

Figure 1D:
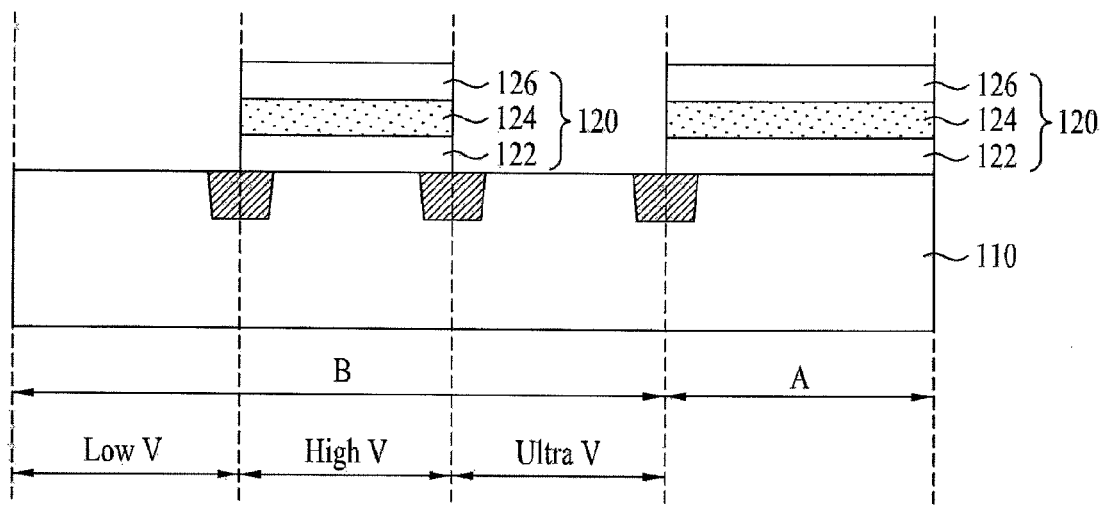

As illustrated in example FIG. 1D, an etching process is implemented using first photoresist patterns 130 as masks, thereby removing portions of ONO layer 120 except for portions of ONO layer 120 formed on and/or over memory region A and high voltage region (High V) of logic region B. Accordingly, the etching process results in patterns of ONO layer 120 present only on and/or over memory region A and high voltage region (High V) while exposing the uppermost surface of semiconductor substrate 100 at low voltage region (low V) and ultra high voltage region (Ultra V) of logic region B. First photoresist pattern 130 on and/or over semiconductor substrate 110 is then removed via etching and cleaning processes.

Figure 1E:
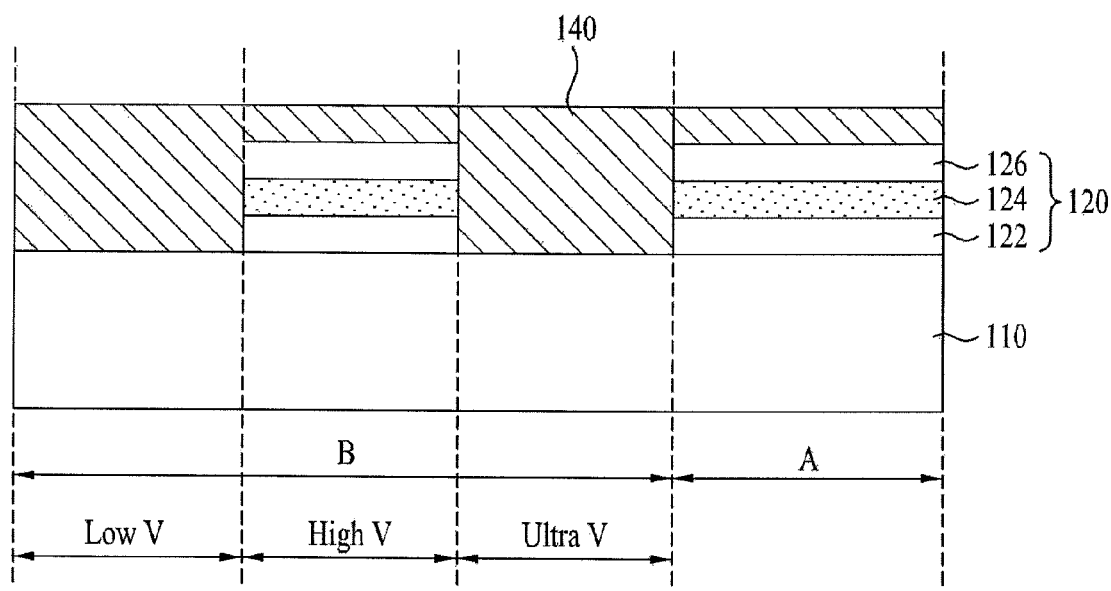

As illustrated in example FIG. 1E, a silicon oxide ($SiO_2$) material is the deposited on and/or over the entire surface of semiconductor substrate 110 and ONO patterns 120, thereby forming first gate oxide layer 140.

Figure 1F:
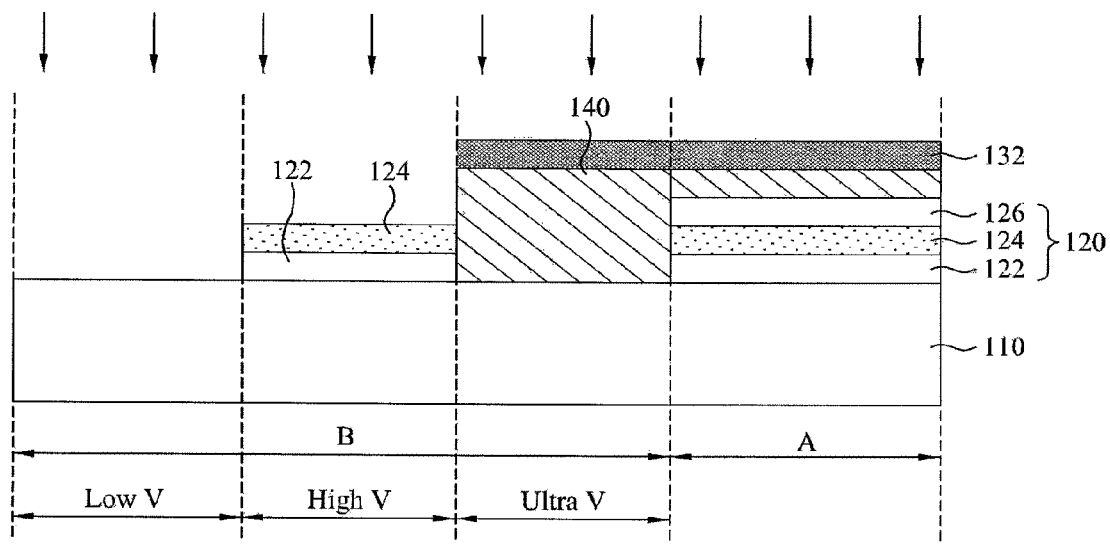

As illustrated in example FIG. 1F, after coating a second photoresist material on and/or over first gate oxide layer 140, a photolithographic process is implemented, thereby forming second photoresist patterns 132 on and/or over memory region A and ultra-high voltage region (Ultra V) of logic region B. An etching process is implemented using second photoresist pattern 132 as a mask and using phosphoric acid ($P_2O_5$) as an etching solution, thereby simultaneously removing a portion of first gate oxide layer 140 formed on and/or over high voltage (High V) and low voltage region (Low V) and also removing second oxide layer 126 of ONO layer 120 formed on and/or over high voltage region (High V). Accordingly, remaining portions of first gate oxide layer 140 remain on and/or over memory region A and ultra-high voltage region (Ultra V). Phosphoric acid ($P_2O_5$) does not react with nitride layer 124 of ONO layer 120 formed on and/or over high voltage region (High V) and therefore, nitride layer 124 formed on and/or over high voltage region (High V) serves as a hard mask. Thereby, first gate oxide layer 140 formed on and/or over low voltage region (Low V) of logic region B is removed. In addition, first gate oxide layer 140 and second oxide layer 126 of ONO layer 120 formed on and/or over high voltage region (High V) of logic region B are removed. Therefore, first gate oxide layer 140 is formed on and/or over ONO layer 120 of memory region A and ultra-high voltage (Ultra V) of logic region B.

Figure 1G:
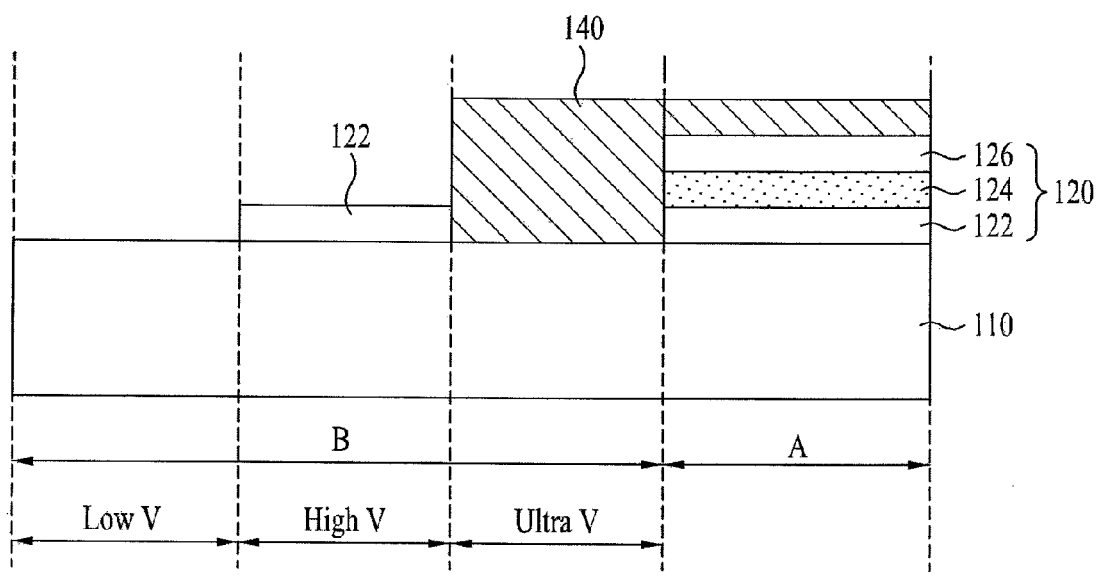

As illustrated in example FIG. 1G, semiconductor substrate 110 is subjected to an etching process using hydrofluoric (HF) acid as an etching solution, thereby removing nitride layer 124 from high voltage region (High V) of logic region B. Second photoresist pattern 132 formed on and/or over semiconductor substrate 110 is removed via etching and cleaning processes.

Figure 1H:
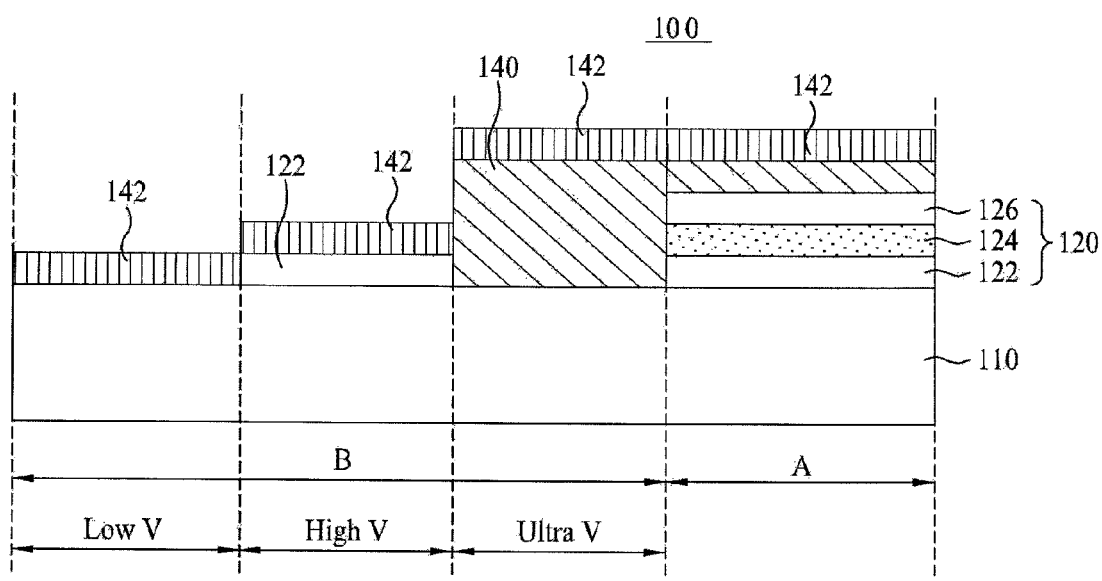

As illustrated in example FIG. 1H, a second silicon oxide ($SiO_2$) material is deposited on and/or over the entire surface of semiconductor substrate 110, thereby forming second gate oxide layer 142 on and/or over the entire surface of semiconductor substrate 110 including low voltage region (Low V) of logic region B.

With the method for manufacturing the SONOS semiconductor device in accordance with embodiments, the processes for forming ONO layer 120 on and/or over memory region A and forming first gate oxide layer 140 and second gate oxide layer 142 on and/or over logic region B require two photoresist mask processes.

As apparent from the above description, in the method for manufacturing the SONOS semiconductor device in accordance with embodiments, when forming ONO layer 120 on and/or over memory region A and first gate oxide layer 140 and second gate oxide layer 142 on and/or over logic region B, the nitride layer formed on and/or over logic region B can be used as a hard mask, thereby enabling a reduction in the number of masks used as compared to the previously described method. This results in maximized manufacturing efficiency and reduced manufacturing costs.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A method for manufacturing a SONOS semiconductor device comprising:
simultaneously forming a device isolation layer in a semiconductor substrate to define a memory region and a logic region, and also forming device isolation layers to define the logic region into an ultra-high voltage region, a high voltage region and a low voltage region; and then forming an ONO layer in the logic region and the memory region by sequentially forming a first oxide layer, a nitride layer and a second oxide layer over the entire surface of the semiconductor substrate; and then forming a first photoresist pattern in the memory region and the high voltage region; and then forming an ONO layer pattern in the memory region and the high voltage region by implementing a first etching process using the first photoresist pattern as a mask; and then removing the first photoresist pattern; and then depositing a first silicon oxide material over the entire surface of the semiconductor substrate; and then forming a second photoresist pattern in the memory region and the ultra-high voltage region; and then simultaneously removing the second oxide layer of the ONO layer pattern in the high voltage region while forming a first gate oxide layer pattern composed of the first silicon oxide material in the memory region and the ultra-high voltage region by implementing a second etching process using the second photoresist pattern as a mask; and then removing the nitride layer of the ONO layer pattern in the high voltage region by implementing a third etching process on the semiconductor substrate; and then removing the second photoresist pattern; and then forming a second gate oxide layer pattern over the entire surface of the semiconductor substrate semiconductor substrate including the low voltage region.

2. The method of claim 1, wherein the device isolation layer is formed via local oxidation of silicon (LOCOS).

3. The method of claim 1, wherein the device isolation layer is formed via shallow trench isolation (STI).

4. The method of claim 1, wherein the second etching process is a wet etching.

5. The method of claim 4, wherein the wet etching uses phosphoric acid ($P_2O_5$) as an etching solution.

6. The method of claim 1, wherein the third etching process is a wet etching process.

7. The method of claim 6, wherein the wet etching uses hydrofluoric (HF) acid as an etching solution.

8. The method of claim 1, wherein forming the ONO layer pattern comprises removing portions of the ONO layer in the low voltage and the ultra-high voltage region while leaving an ONO layer patterns in the memory region and the high voltage region.

9. The method according to claim 1, wherein simultaneously removing the second oxide layer while forming the first gate oxide layer pattern comprises:

removing a portion of the first silicon oxide in the low voltage region and the high voltage region while leaving a portion of the first silicon oxide layer in the memory region and the ultra-high voltage region; and then removing the second oxide layer of the ONO layer pattern in the high voltage region.

10. The method of claim 1, wherein the nitride layer of the ONO pattern in the high voltage region is removed by an etching process using hydrofluoric (HF) acid as an etching solution.

11. A method for manufacturing a SONOS semiconductor device comprising:

simultaneously forming a first device isolation layer in a semiconductor substrate to define a memory region and a logic region, and also forming second device isolation layers to define the logic region into a first logic region, a second logic region and a third logic region; and then forming an ONO layer by sequentially forming a first oxide layer, a nitride layer and a second oxide layer in the memory region, the first logic region, the second logic region and the third logic region; and then forming a first photoresist pattern in the memory region and the second logic region; and then forming an ONO layer pattern in the memory region and the second logic region by performing a first etching process using the first photoresist pattern as a mask and then removing the first photoresist pattern; and then depositing a first silicon oxide in the memory region, the first logic region, the second logic region and the third logic region; and then forming a second photoresist pattern in the memory region and the first logic region; and then simultaneously removing the second oxide layer of the ONO layer pattern in the second logic region and forming a first gate oxide layer pattern in the memory region and the first logic region by performing a second etching process using the second photoresist pattern as a mask; and then removing the nitride layer of the ONO layer pattern in the second logic region by performing a third etching process; and then removing the second photoresist pattern; and then forming a second gate oxide layer pattern in the memory region, the first logic region, the second logic region and the third logic region.

12. The method of claim 11, wherein the first logic region comprises an ultra-high voltage region, the second logic region comprises a high voltage region and the third logic region comprises a low voltage region.

13. The method of claim 12, wherein forming the ONO layer pattern comprises exposing the semiconductor substrate in the low voltage region and the ultra-high voltage region.

14. The method of claim 12, wherein the second etching process is performing using the nitride layer in the high voltage region as a hard mask.

15. The method of claim 12, wherein forming the second gate oxide layer pattern comprises forming the second gate oxide layer pattern on and contacting the semiconductor substrate in the low voltage region, on and contacting the first oxide layer in the high voltage region, on and contacting the first gate oxide layer pattern in the ultra-high voltage region and on and contacting the first gate oxide layer pattern in the memory region.

16. The method of claim 12, wherein the nitride layer in the ONO pattern of the high voltage region is removed by an etching process using hydrofluoric (HF) acid as an etching solution.

17. The method of claim 11, wherein the first gate oxide layer and the second gate oxide layer are composed of silicon oxide.

18. The method of claim 11, wherein the first and second device isolation layers comprise shallow trench isolation layers.

19. The method of claim 11, wherein the second etching process comprises a wet etching using phosphoric acid ($P_2O_5$) as an etching solution.

20. The method of claim 11, wherein the third etching process comprises a wet etching process using hydrofluoric (HF) acid as an etching solution.

* * * * *